United States Patent
Chang et al.

[11] Patent Number: 5,994,239
[45] Date of Patent: Nov. 30, 1999

[54] MANUFACTURING PROCESS TO ELIMINATE POLYSTRINGERS IN HIGH DENSITY NAND-TYPE FLASH MEMORY DEVICES

[75] Inventors: Kent Kuohua Chang; Hao Fang, both of Cupertino; Ken Au, Fremont; David Chi, Sunnyvale, all of Calif.

[73] Assignee: Advanced Micro Devices, Inc., Sunnyvale, Calif.

[21] Appl. No.: 08/993,343

[22] Filed: Dec. 18, 1997

[51] Int. Cl.⁶ .................................................. H01L 21/00
[52] U.S. Cl. .......................... 438/745; 438/719; 438/742; 438/751
[58] Field of Search ..................... 438/718, 719, 438/720, 723, 734, 735, 737, 738, 742, 743, 745, 752, 753, 751

[56] References Cited

U.S. PATENT DOCUMENTS

| | | | |
|---|---|---|---|
| 4,488,351 | 12/1984 | Momose | 438/304 |
| 4,521,448 | 6/1985 | Sasaki | 438/596 |
| 4,727,038 | 2/1988 | Watabe et al. | 438/304 |
| 4,818,334 | 4/1989 | Shwartzman et al. | 438/720 X |
| 5,015,598 | 5/1991 | Verhaar | 438/304 |
| 5,019,879 | 5/1991 | Chiu | 357/23.5 |
| 5,021,848 | 6/1991 | Chiu | 357/23.5 |
| 5,108,939 | 4/1992 | Manley et al. | 437/43 |
| 5,115,288 | 5/1992 | Manley | 357/23.5 |
| 5,266,509 | 11/1993 | Chen | 437/43 |
| 5,284,784 | 2/1994 | Manley | 437/43 |
| 5,342,801 | 8/1994 | Perry et al. | 437/52 |
| 5,397,725 | 3/1995 | Wolstenholme et al. | 437/43 |
| 5,422,292 | 6/1995 | Hong et al. | 437/43 |
| 5,427,967 | 6/1995 | Sadjadi et al. | 437/43 |
| 5,618,742 | 4/1997 | Shone et al. | 438/263 |
| 5,631,482 | 5/1997 | Hong | 257/326 |
| 5,639,681 | 6/1997 | Carmody et al. | 437/52 |
| 5,705,419 | 1/1998 | Perry et al. | 437/48 |
| 5,789,293 | 8/1998 | Cho et al. | 438/257 |

OTHER PUBLICATIONS

Wolf, S., and Tauber, R., *Silicon Processing for the VLSI Era*, vol. 1, Lattice Press (1996), pp. 532–533.

*Primary Examiner*—William Powell
*Attorney, Agent, or Firm*—Skjerven, Morrill, MacPherson, Franklin, & Friel, LLP; Edward C. Kwok; Glen B. Choi

[57] ABSTRACT

Polystringers that cause NAND-type memory core cells to malfunction are removed. A SiON layer, tungsten silicide layer, second polysilicon layer, ONO dielectric, and first polysilicon layer are successively removed from between NAND-type flash memory core cells leaving ONO fence that shields some first polysilicon layer material from removal. Next, the device is exposed to oxygen gas in a high temperature environment to oxidize the surface of the device, and in particular to remove the polystringers.

5 Claims, 8 Drawing Sheets

MANUFACTURING PROCESS TO ELIMINATE POLYSTRINGERS IN HIGH DENSITY NAND-TYPE FLASH MEMORY DEVICES

BACKGROUND OF THE INVENTION

1. Field of the Invention

This invention relates to memory cells and methods for manufacture thereof. Specifically, the present invention relates to a method for manufacturing memory cells free of polystringers.

2. Discussion of Related Art

FIG. 1 shows a cross-sectional view of a portion of a core cell in a NAND-type flash memory device. Fabrication of a NAND-type flash memory device involves depositing a lower polysilicon ("poly I") layer 2 over tunnel oxide layer 8 and etching it so as to provide the structure shown over active region 10 of FIG. 2.

The exact profile of the etched structure of poly I layer 2 is hard to control. The profile depends on the photoresist profile and the etch process. Consequently, the overlap between the structure of poly I layer 2 and the underlying core field oxide regions 12 vary. FIG. 2 depicts, for example, an edge of the structure of poly I layer 2 not overlapping a flat region of a core field oxide region 12. Consequently, a recess 14 forms in poly I layer 2 over a sloping portion of core field oxide region 12 that may appear along the entire edge of poly I layer 2. For example, recess 14 can be caused by a horizontal etching of poly I layer 2. Recess 14 harbors ONO 4 and poly II layer 6 materials from subsequent ONO 4 and poly II layer 6 depositions.

Next, as shown in FIG. 1, a triple layer consisting of an oxide-nitride-oxide ("ONO") stack, shown as ONO 4, and polysilicon ("poly II") layer 6 are provided above the poly I layer 2 structure. A tungsten silicide layer 93 and a silicon oxy-nitride (SiON) layer 94 are formed next.

FIG. 3 corresponds to a top view of the structure of FIG. 1. In FIG. 3, core field oxide regions 40a and 40b correspond to portions of core field oxide regions 12 of FIG. 1; active region 42 corresponds to a portion of active region 10 of FIG. 1; and poly I layer 66 corresponds to a portion of poly I layer 2 of FIG. 1.

Next, successive layers of material are removed from shaded region 100 of the structure 58 of FIG. 3 ("removal steps"): SiON layer 94, tungsten silicide layer 93, poly II layer 6, ONO 4, and poly I layer 2. The ONO 4 layer and poly I layer 2 may be removed by "anisotropic" etching techniques.

However, if the poly II layer 6 forms in the recess 14, it may not be removed from the recess 14 in shaded region 100 of FIG. 3. The poly II layer 6 in the recess 14 also may shield ONO 4 from removal from the recess 14 present in shaded region 100 of FIG. 3. Remaining ONO 4 ("ONO fence" 16) further shields poly I layer 2 from removal from the shaded region 100 of FIG. 3.

Alternatively, edges of the etched poly I layer 2 may overlap with top, flat portions of core field oxide regions 12 and consequently recesses 14 may be absent from the poly I layer 2 as shown in FIG. 4. However, because of anisotropic etching of ONO 4 layer, following removal of the ONO 4 from shaded region 100 of the structure 58 of FIG. 3, ONO fences 16 may remain.

FIG. 5A shows a top view of the structure 60 of FIG. 4 after the removal steps described earlier. ONO fences 16 appear, for example, at positions 48a, 48b, 48c, and 48d of FIG. 5A. ONO fences 16 shield some poly I layer 2 material from removal during the removal steps. Remaining poly I materials present, for example, at positions 48a, 48b, 48c, and 48d of FIG. 5A ("polystringers" 18) electrically short NAND-type memory cells.

FIG. 5B depicts a cross section of the structure 62 of FIG. 5A showing ONO fence 16 and polystringers 18. Structure 70 of FIG. 5B corresponds, for example, to a cross section along line X2—X2 of structure 62 of FIG. 5A. In that cross section, core field oxide regions 12 correspond to portions of core field oxide regions 40a and 40b of FIG. 5A, and active region 10 corresponds to a portion of active region 42 of FIG. 5A. Poly I layer 46 of FIG. 5A corresponds to a portion of poly I layer 2 of FIG. 4.

FIG. 6A depicts a matrix of NAND-type flash memory core cells 22 with polystringers occurring, for example, at positions 20. Consequently, as shown in FIGS. 6A and 6B, following etching, an "ONO fence" 16, portions of poly II layer 6, and portions of poly I layer 2 may remain at positions 20.

FIG. 6B corresponds, for example, to a cross section along line X—X of the structure of FIG. 6A. FIG. 6B depicts a position 20 that may include portions of poly II layer 6 and portions of poly I layer 2 that constitute polystringers 18 that electrically short NAND-type flash memory core cells 22, thereby rendering the flash memory core cells inoperable.

SUMMARY OF THE INVENTION

The present invention removes polystringers that cause NAND-type memory core cells to malfunction.

After a SiON layer, a tungsten silicide layer, a second polysilicon layer, an ONO layer, and a previously etched first polysilicon layer on the surface of an oxide coated silicon substrate have been removed from between NAND-type flash memory core cells, ONO fence and polystringers remain. In accordance with the present invention, device is next exposed to oxygen gas in a high temperature environment to oxidize the surface of the device, and in particular to oxidize the polystringers.

An additional advantage results in the form of a higher coupling ratio between the control and floating gates of a NAND-type memory device. During oxidation of the polystringers, the lower edges of the floating gate round. Consequently, a lower voltage is required at the control gate to achieve a desired voltage at the floating gate. In a NAND-type memory device, a smaller control gate voltage will be required to perform channel program and erase functions.

An additional advantage results from the rounded lower edges of the floating gate. The lower edges of the floating gate become thicker which increases the breakdown voltage and hence improves the reliability of the floating gate.

The present invention is better understood upon consideration of the detailed description below, in conjunction with the accompanying drawings.

DETAILED DESCRIPTION OF THE PREFERRED EMBODIMENTS

Figure 7:
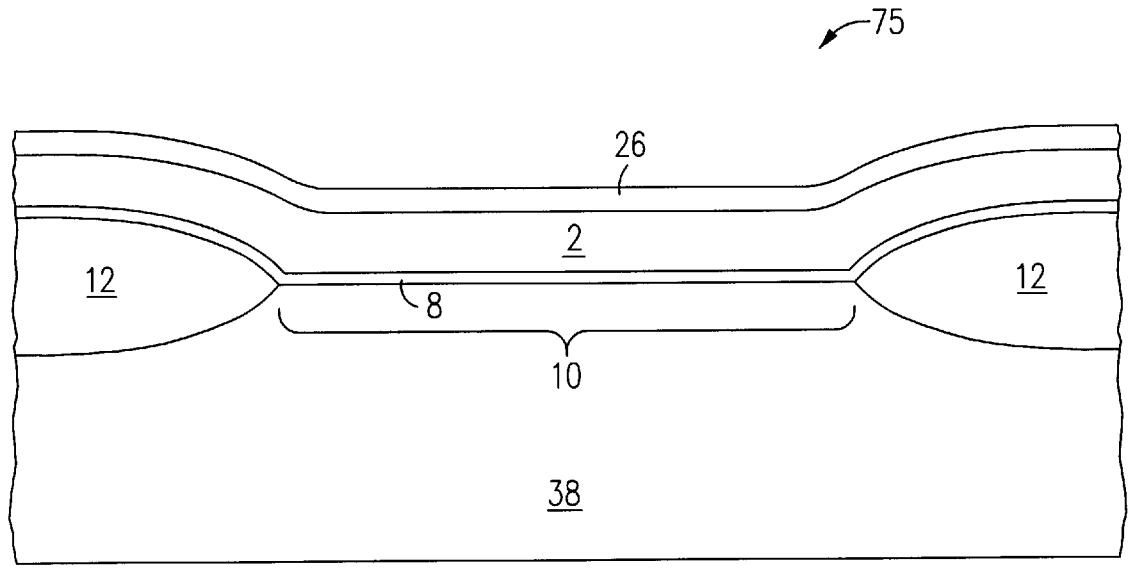
FIG. 7 depicts a cross-sectional view of a structure 75 showing a core cell of a NAND-type flash memory device, including a poly I layer 2 and an oxide mask layer 26.

One embodiment of the present invention is provided in a NAND-type flash memory core cell formed on a silicon substrate 38 having an active region 10 between core field oxide regions 12, as shown in FIG. 7.

In FIG. 7, tunnel oxide layer 8 is grown over silicon substrate 38 by directing a stream consisting of argon and $O_2$ gases over the surface of silicon substrate 38 at flow rates of 12.6 L/min and 1.33 L/min, respectively, which silicon substrate 38 is heated to a temperature of 1050 degrees Celsius. In this embodiment, a tunnel oxide layer 8 is formed to 87 angstroms in thickness.

Next, a layer of amorphous silicon is deposited over tunnel oxide layer 8 using a low pressure chemical vapor deposition (LPCVD) process at a temperature of 530 degrees Celsius. The LPCVD process directs a mixture of silane gas ($SiH_4$) and phosphene gas ($PH_3$) towards tunnel oxide layer 8 at flow rates of 2000 sccm and 2.2 sccm, respectively. The amorphous silicon is thereby doped in situ by the phosphene gas to become an N-type amorphous silicon region that corresponds to an intermediate form of polysilicon (poly I) layer 2. In this embodiment, the poly I layer 2 is formed to 700 angstroms in thickness.

An oxide layer 26 is next formed over poly I layer 2 using an CVD process. In the CVD process, a mixture of silane ($SiH_4$) and $N_2O$ gases with flow rates of 1 L/min and 60 L/min, respectively, are directed towards the surface of the poly I layer 2, at a temperature between 400 to 800 degrees Celsius. A temperature of 800 degrees Celsius is suitable. In this embodiment, oxide layer 26 is 300 to 400 angstroms thick.

Thereafter, a photoresist material is applied and patterned over the structure 75 of FIG. 7, including the portion of oxide layer 26 over active region 10.

Figure 8:
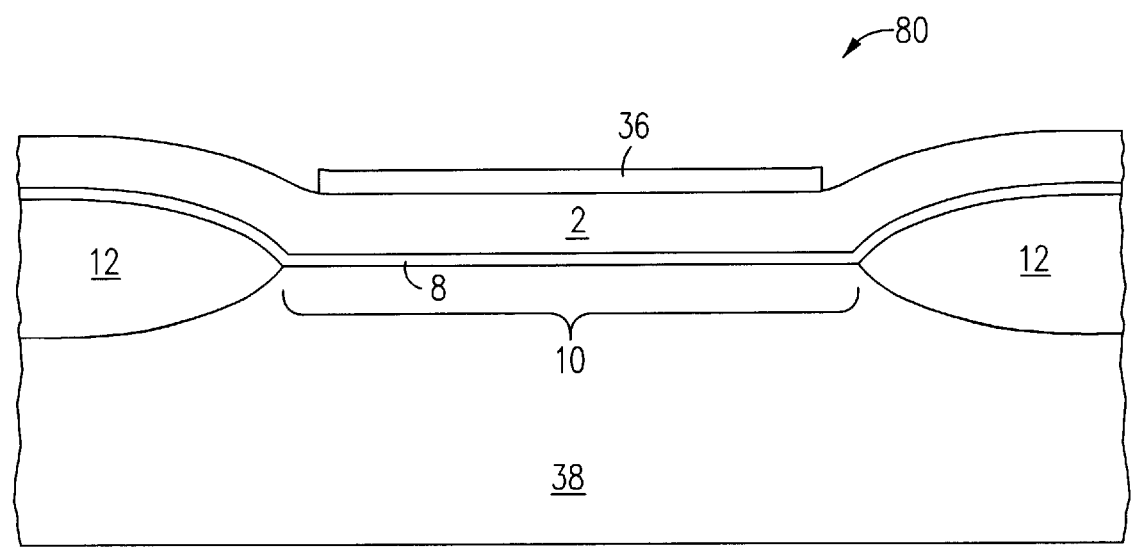
FIG. 8 depicts a cross-sectional view of structure 80 showing structure 75 of FIG. 7 after the oxide mask 26 has been etched.

Next, as shown in FIG. 8, oxide mask 36 is formed over active region 10 using either a dry or wet etch technique. If a wet etch technique is used, structure 75 of FIG. 7, is exposed to a 40:1 hydrogen-fluoride (HF) solution for a suitable time such as 80 seconds.

Several dry etch techniques are suitable. In one dry etch technique, methyl-trifluoride ($CHF_3$) and helium (He) gases having flow rates of 75 sccm and 6000 sccm, respectively, are directed at structure 75 for 6 seconds. An alternate dry etch technique is to expose the device to fluoro-form ($CF_4$) and $CHF_3$ at flow rates of 15 sccm and 35 sccm, respectively, for 10 seconds.

Next, poly I layer 2 is etched using an anisotropic dry etch technique so as to remove the portion of poly I layer 2 above core field oxide regions 12. A suitable dry etch for this purpose directs chlorine ($Cl_2$) and hydrogen bromide (HBr) gases at flow rates of 30 sccm and 70 sccm, respectively, at structure 80 of FIG. 8 until etching of tunnel oxide layer 8 is detected. Tunnel oxide layer 8 thereby acts as the "stop layer". In this embodiment, the RF power of the etcher is set to 120 W at a pressure of 125 millitorr.

Figure 9A:
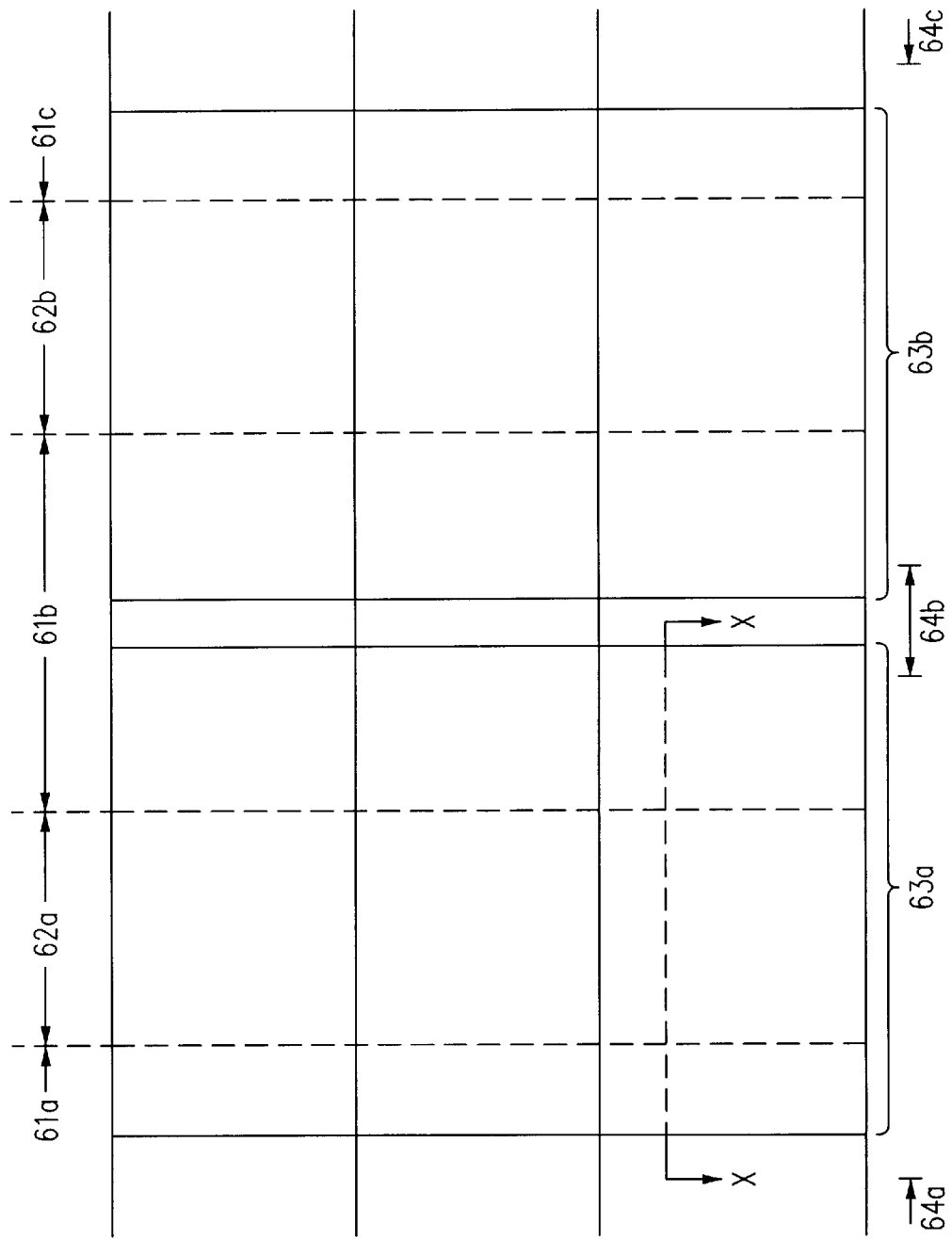
FIG. 9A depicts a top view of core field oxide regions 61a, 61b, and 61c and active regions 62a and 62b overlapped by patterned poly I structures 63a and 63b with oxide mask coating.
Figure 9B:
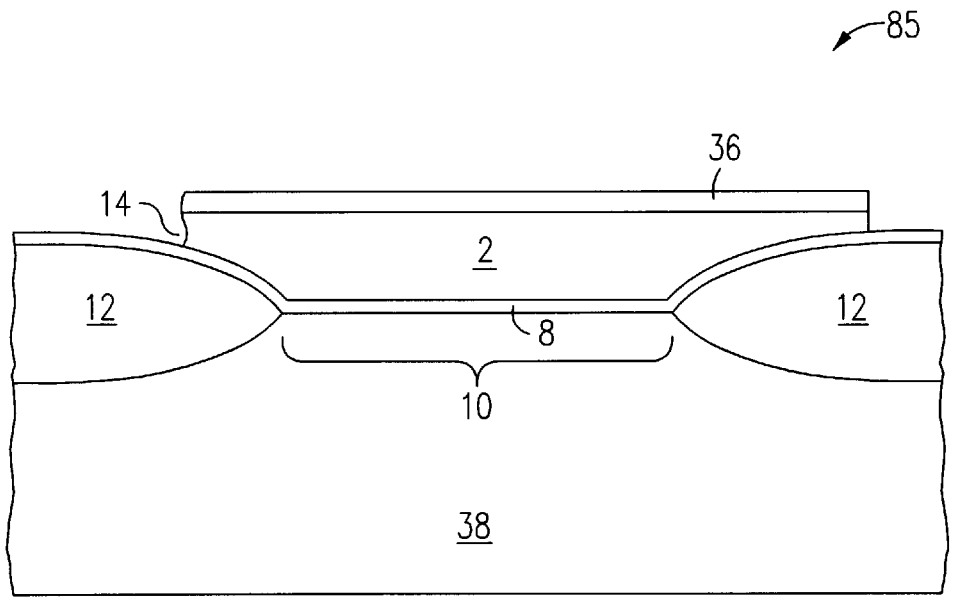
FIG. 9B depicts a structure 85 that corresponds to a cross-sectional view of the structure of FIG. 9A along line X—X.

FIG. 9A shows a top view of core field oxide regions 61a, 61b, and 61c and active regions 62a and 62b over silicon substrate 38. Structure 85 of FIG. 9B corresponds, for example, to a cross section along line X—X of FIG. 9A. In that cross-section, core field oxide regions 12 correspond to portions of core field oxide regions 61a and 61b, and active region 10 corresponds to a portion of active region 62a.

Poly I layer 2 is protected by photoresist during the polysilicon etch step described above. Ideally, patterned poly I structures 63a and 63b are provided covering the sloped "bird's beaks" portions of core field oxide regions 61a, 61b, and 61c thereby exposing "flat" regions 64a, 64b, and 64c of core field oxide regions 61a, 61b, and 61c. However, a misalignment may occur so that patterned poly I structures 63a and 63b expose the sloped bird's beak regions of core field oxide regions of 61a, 61b, and 61c.

Figure 10:
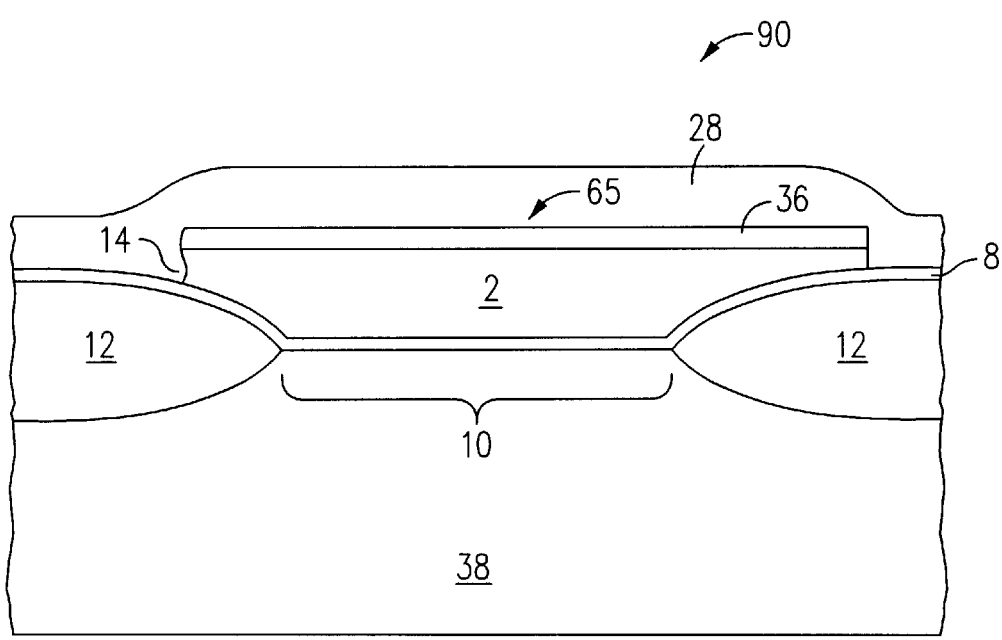
FIG. 10 depicts a cross-sectional view of a structure 90 showing structure 85 after a second layer 28 of polysilicon has been deposited.

As discussed above, such misalignment may lead to a recess and polystringer formation. As shown in FIG. 10, the present invention provides a second layer of amorphous silicon over the structure 85 of FIG. 9B. Amorphous silicon layer is formed directing a mixture of silane gas ($SiH_4$) and phosphene ($PH_3$) over structure 85 at rates of 2000 sccm and 2.8 sccm, respectively, using a CVD process with a temperature of 530 degrees. The second layer of amorphous silicon is thereby doped in situ by the phosphene becoming an N-type amorphous silicon region much like poly I layer 2. The second layer of amorphous silicon corresponds to an intermediate form of second layer 28 of polysilicon. In this embodiment, second layer 28 has a thickness between 800 and 900 angstroms.

Figure 11:
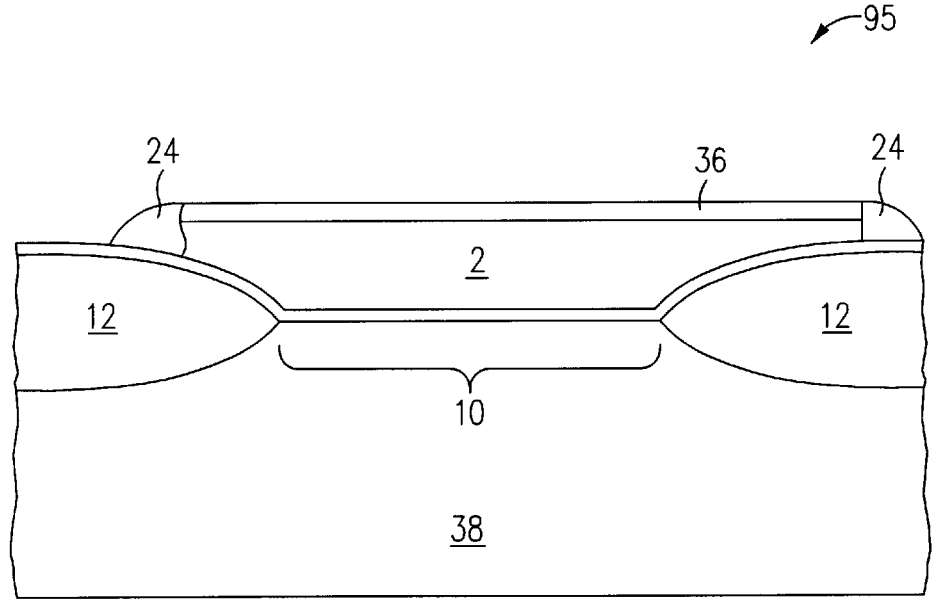
FIG. 11 depicts a cross-sectional view of structure 95 showing polysilicon spacers 24 formed on sides of poly I layer 2.

Second layer 28 is next etched anisotropically leaving structure 95 with polysilicon spacers 24, as shown in FIG. 11. In this etching step, etched oxide mask region 36 acts as a "stop layer". Polysilicon spacers 24 extend the portions of poly I layer 2 in structure 85 of FIG. 9B sealing any recesses, such as recess 14, that lead to polystringer formation in the prior art.

Oxide mask 36 is then removed. A suitable technique is a wet etch technique whereby the structure 95 of FIG. 11 is exposed to a 40:1 HF solution for 80 seconds.

Next, an ONO 4 dielectric layer is deposited conventionally. In this embodiment, ONO 4 layer includes a 50 angstroms thick lower oxide layer, an 80 angstroms thick middle nitride layer, and a between 40 and 45 angstroms thick upper oxide layer 4a. The upper oxide layer 4a (not separately shown in the Figures) is achieved by oxidizing approximately 25 angstroms of the nitride layer. In this embodiment, the thickness of ONO 4 is approximately 130 angstroms.

Next, a third layer of amorphous silicon is deposited over the ONO layer using a mixture of silane gas ($SiH_4$) and phosphene ($PH_3$) in an LPCVD process. This third layer of amorphous silicon corresponds to an intermediate form of a third layer of polysilicon (poly II layer) 6. In this embodiment, the thickness of the poly II layer 6 is 1200 angstroms.

Next a layer of tungsten silicide 93 is deposited conventionally over the device by a mixture of silane and $WF_6$ using a CVD process. In this embodiment, the thickness of the tungsten silicide layer is 1500 angstroms.

Next a layer of silicon oxy-nitride 94 (SiON) is deposited conventionally over the tungsten silicide layer using a mixture of silane and $N_2O$ in a CVD process. In this embodiment, the thickness of the SiON layer is 1500 angstroms.

Figure 1:
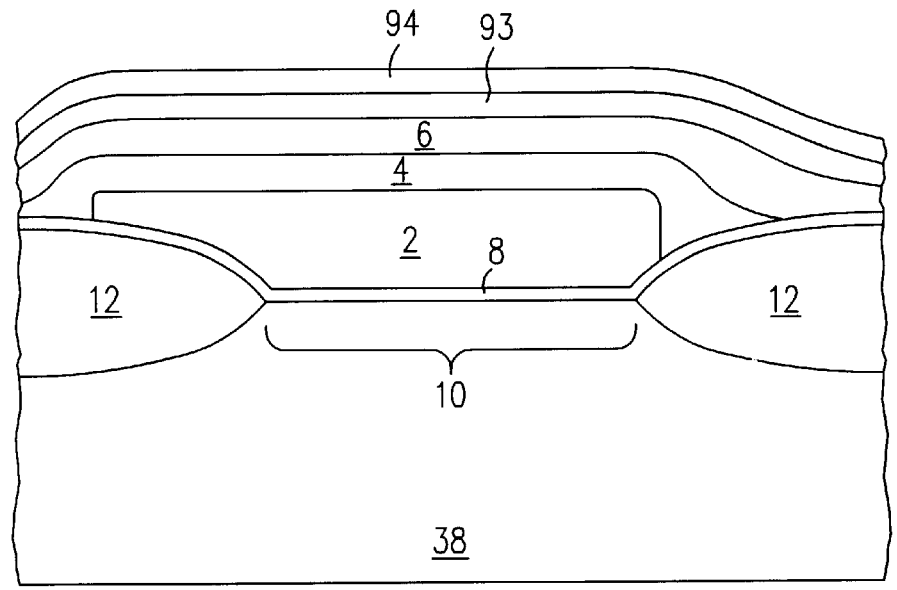
FIG. 1 depicts a cross section of a portion of a NAND-type flash memory core cell.
Figure 2:
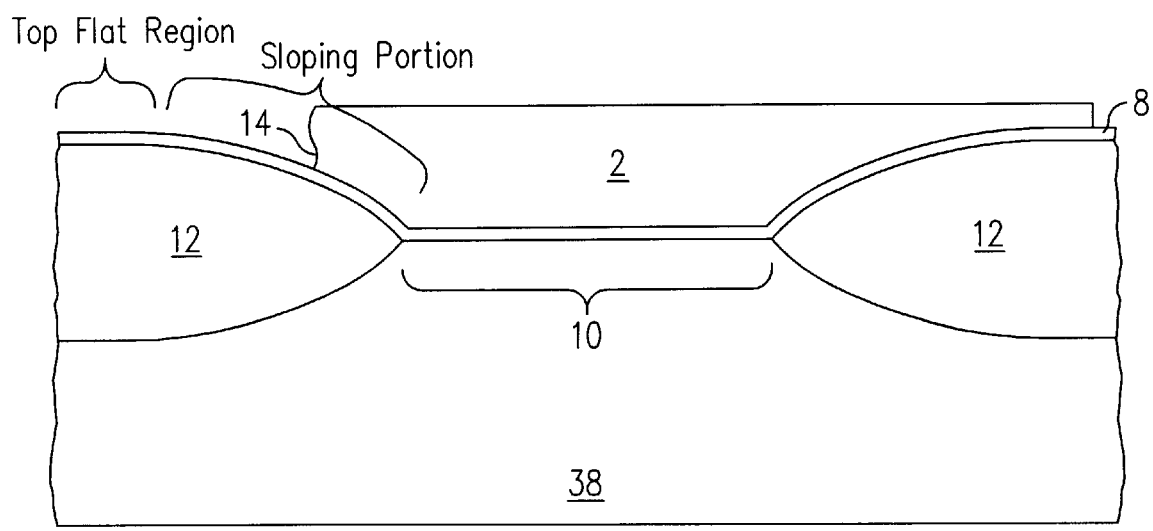
FIG. 2 depicts a cross section of a portion of a NAND-type flash memory core cell and a recess 14 formed in the etched poly I layer 2 that may run along the entire edge of the etched poly I layer 2.
Figure 3:
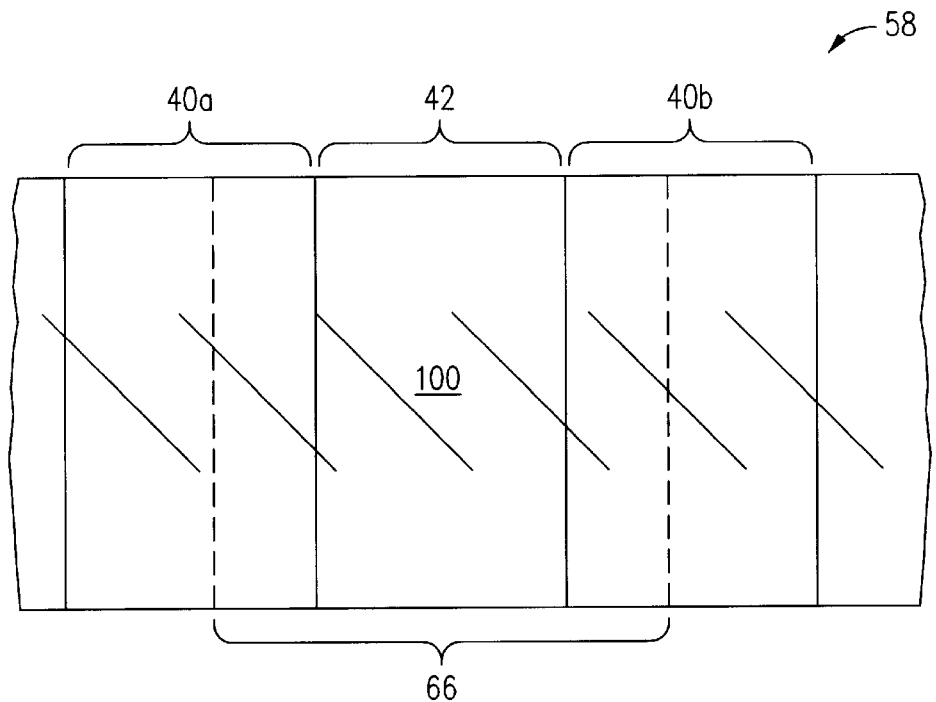
FIG. 3 depicts a top view of the structure of FIG. 1 showing shaded region 100 where SiON layer 94, tungsten silicide layer 93, poly II layer 6, ONO 4 layer, and poly I layer 2 are removed.
Figure 4:
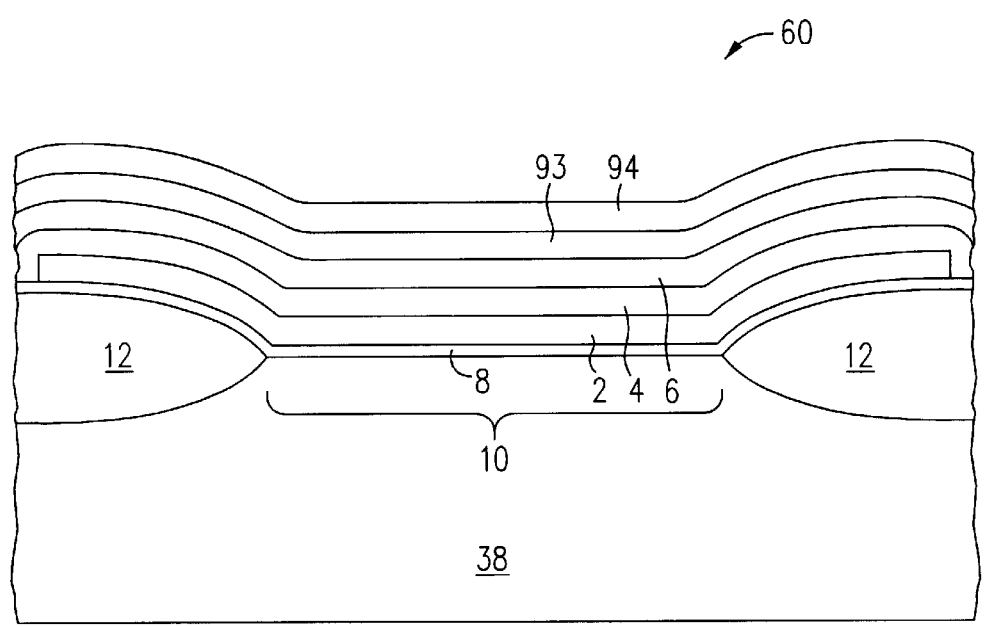
FIG. 4 depicts a cross section of a portion of a NAND-type flash memory core cell where edges of the etched poly I layer 2 overlap with portions of the top, flat regions of the core field oxide regions 12 and no recesses 14 are present.

FIG. 3 depicts a top view of the structure of FIG. 1. In FIG. 3, core field oxide regions 40a and 40b correspond to portions of core field oxide regions 12 of FIG. 1; active region 42 corresponds to a portion of active region 10 of FIG. 1; and poly I layer 66 corresponds to poly I layer 2 of FIG. 1.

The SiON layer 94, tungsten silicide layer 93, poly II layer 6, the ONO 4 layer, and poly I layer 2 with polysilicon spacers 24 are then removed successively from region 100 of the structure 58 of FIG. 3. Suitable techniques to remove SION layer 94, tungsten silicide layer 93, poly II layer 6 are separate etches. To remove poly II layer 6, the stop layer may be set as the upper oxide layer 4a of ONO 4. Suitable techniques to remove ONO 4 layer and poly I layer 2 are separate "self align etches".

Figure 5A:
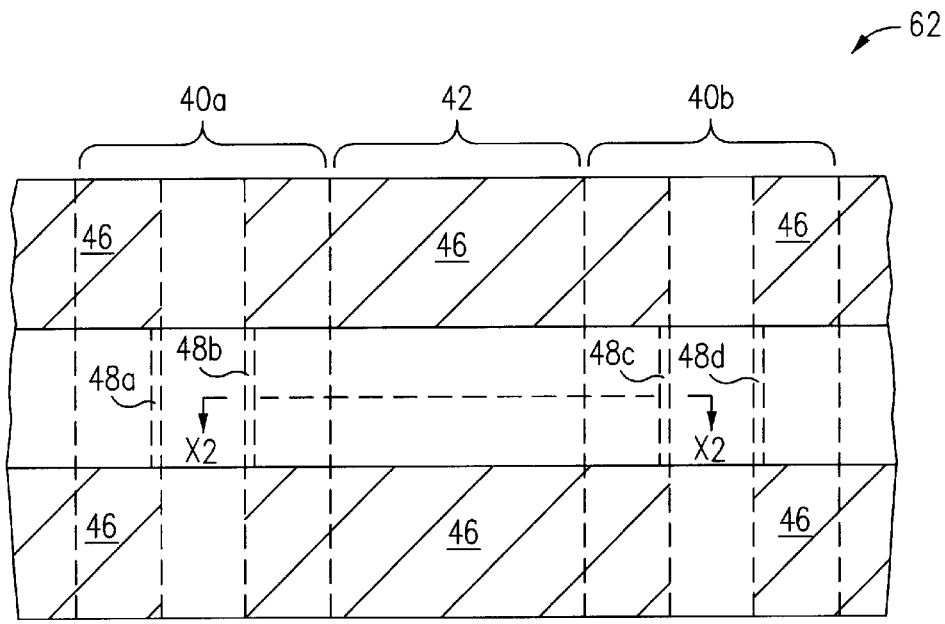
FIG. 5A depicts a structure 62, that corresponds to a top view of the structure 60 of FIG. 4, after material has been removed, with positions 48a, 48b, 48c, and 48d where ONO fences 16 and polystringers 18 of FIG. 4B may appear.
Figure 5B:
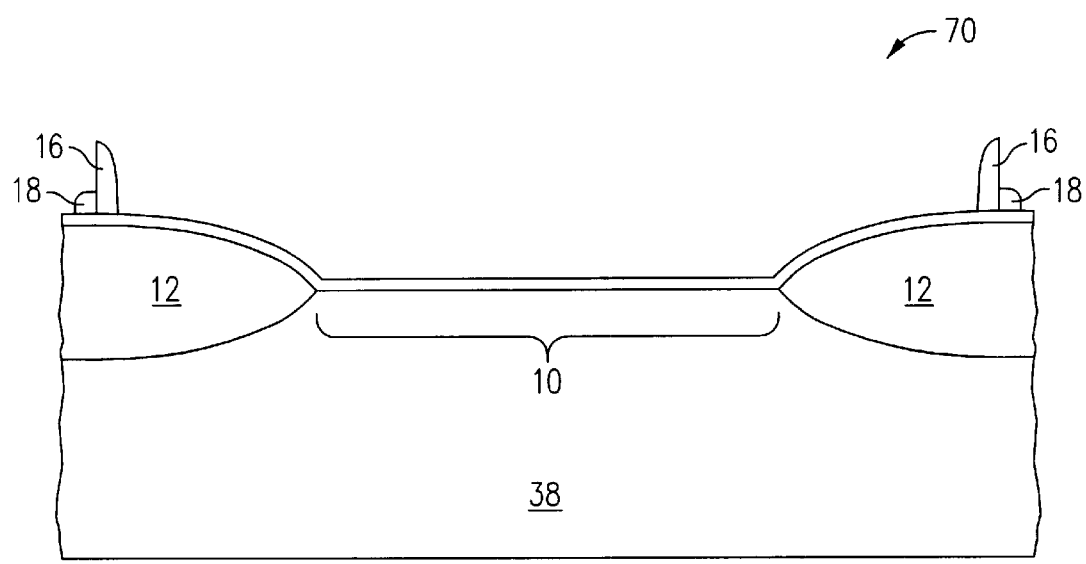
FIG. 5B depicts a structure 70 that corresponds to a cross section of the structure 62 of FIG. 5A along line X2—X2 showing ONO fence 16 and polystringers 18.
Figure 6A:
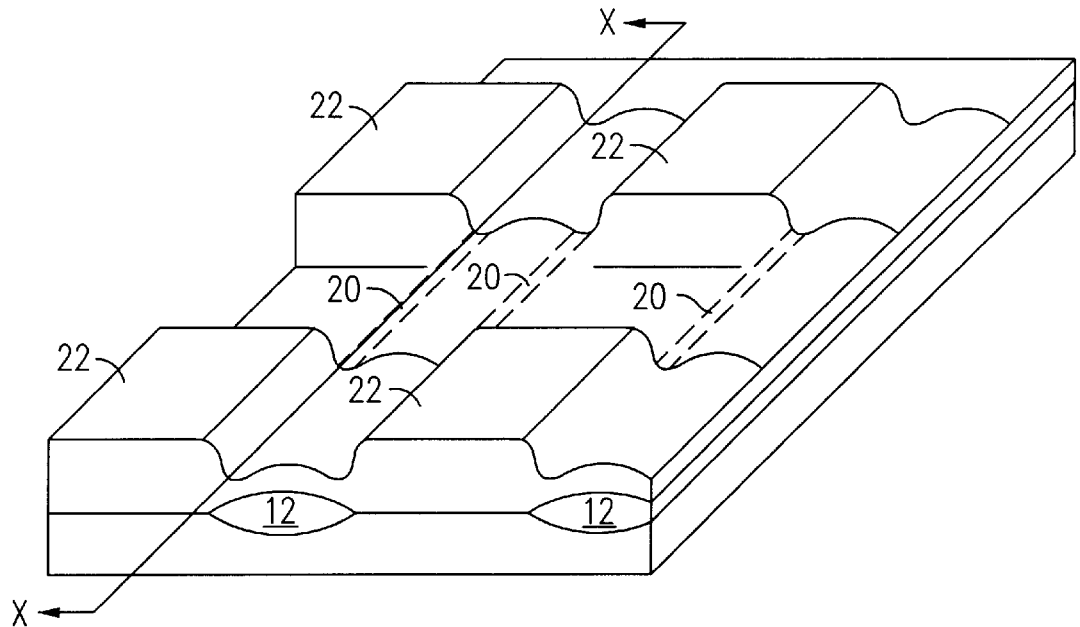
FIG. 6A depicts a prospective view of four NAND-type flash memory core cells 22 and the polystringers 18 at positions 20 that cause electrical short circuits among NAND-type flash memory core cells 22.
Figure 6B:
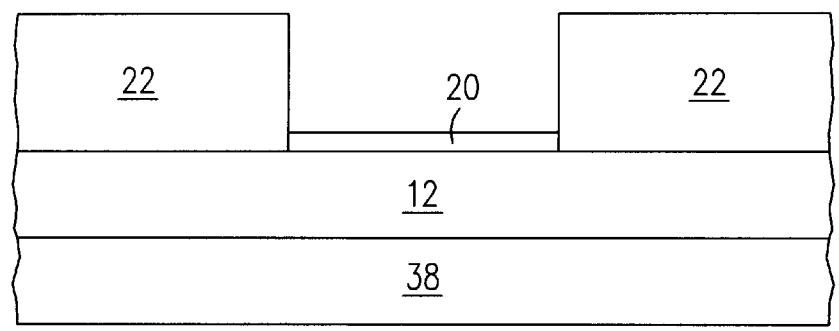
FIG. 6B depicts a cross-sectional view of the structure of FIG. 6A showing polystringers at position 20 between NAND-type flash memory core cells 22.

Any ONO fences, for example, ONO fence 16 present at positions 48a, 48b, 48c, and 48d of FIG. 5A, are next removed ("ONO fence removal step"). A suitable technique is to expose the structure 62 of FIG. 5A to a 100:1 hydrogen fluoride (HF) solution at room temperature for a maximum duration of 60 seconds. An alternative technique is to expose the structure 62 of FIG. 5A to a 40:1 hydrogen fluoride (HF) solution at room temperature for a maximum duration of 35 seconds. A second alternative technique is to perform a conventional buffer oxide etch for 25 seconds.

The device is then cleaned using a conventional RCA clean process. A suitable technique involves dipping the device in a 5:1:1 water, hydrogen peroxide, and ammonia ($H_2O:H_2O_2:NH_4OH$) solution with a temperature of 60 degrees Celsius for 5 minutes and then rinsing conventionally. Alternatively, the structure may be dipped in a 6:1:1 water, hydrogen peroxide, and hydrogen chloride ($H_2O:H_2O_2:HCl$) solution with a temperature of 60 degrees Celsius for 5 minutes and then rinsed conventionally.

Absent an ONO fence removal step above or in addition to the ONO fence removal step, polystringers such as at positions 48a, 48b, 48c, and 48d of FIG. 5A are next removed (hereinafter "oxidation step"). A suitable technique involves heating the wafer to approximately 900 degrees Celsius. $O_2$ gas is then directed towards the wafer with a flow rate of 14 L/min for 45 minutes.

Almost all polystringers are thereby removed by oxidation. For example, on an 8 inch wafer including NAND-type memory device core cells, very few polystringers may remain on the outside edges.

An additional benefit of the oxidation step is that poly I layer 2 rounds at the lower edges. As a result, the coupling ratio improves between a control gate and floating gate in a NAND-type memory device. The advantage is that with a higher coupling ratio, a smaller voltage is required at the control gate to achieve a desired voltage at the floating gate. For example, in a NAND-type memory device, less control gate voltage will be required to perform channel program and erase functions.

An additional advantage results from the rounded lower edges of the floating gate. The lower edges of the floating gate become thicker thus increasing the breakdown voltage and hence improving the reliability of the floating gate.

Figure 12:
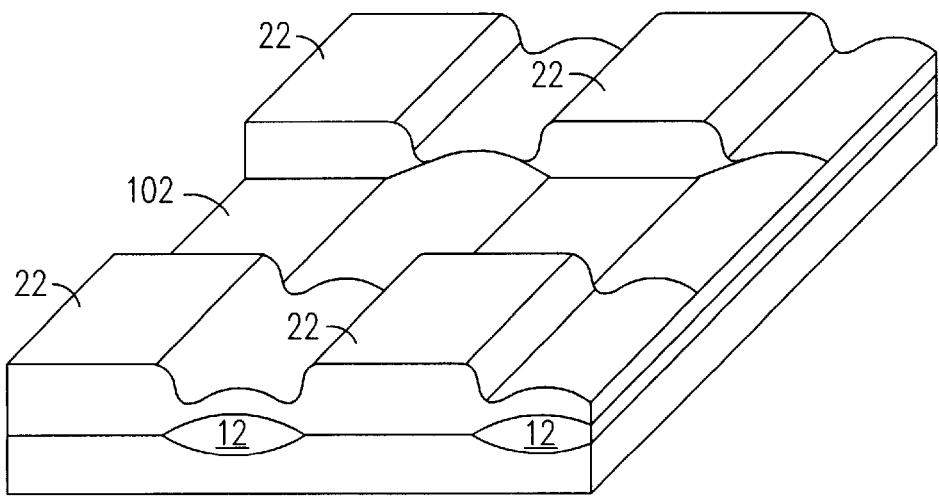
FIG. 12 depicts a prospective view of completed NAND-type flash memory core cells 22 with source/drain region 102.

The remaining processing steps ("remaining steps") include: an MDD implant to form source/drain regions 102; a spacer deposition and etch; an HTO deposition; a contact mask and etch; a contact implant; a metal deposition and etch; and nitride deposition. The remaining steps proceed in the conventional manner. Completed NAND-type memory cells 22 are shown in FIG. 12.

The foregoing description of the preferred embodiments of the invention has been presented for purposes of illustration and description. It is not intended to be exhaustive or to limit the invention to the precise form disclosed. Numerous modifications or variations are possible in light of the above teachings. The embodiments were chosen and described to provide the best illustration of the principles of the invention and its practical application to thereby enable one of ordinary skill in the art to utilize the invention in various embodiments and with various modifications which are suited to the particular use contemplated. All such modifications and variations are within the scope of the invention as determined by the appended claims when interpreted in accordance with the breadth to which they are legally and equitably entitled.

What is claimed is:

1. A method for fabricating a semiconductor device comprising:

providing a first layer of polysilicon on a surface of a semiconductor substrate including core field oxide regions and channel regions;

removing portions of said first layer of polysilicon over top, flat regions of core field oxide regions;

providing a triple layer of oxy-nitride-oxide over said first layer of polysilicon;

removing portions of said triple layer between intended locations of memory core cells;

removing portions of said first layer of polysilicon between intended locations of memory core cells;

removing polysilicon material remaining between intended locations of memory core cells.

2. The method of claim 1 wherein the step of removing polysilicon material uses $O_2$ gas.

3. The method of claim 2 wherein a flow rate is approximately 14 L/min.

4. The method of claim 2 wherein a duration of exposing is approximately 45 minutes.

5. The method of claim 2 wherein an environment temperature is approximately 900 degrees Celsius.

* * * * *